United States Patent
Chan et al.

(10) Patent No.: US 7,813,189 B2
(45) Date of Patent: Oct. 12, 2010

(54) ARRAY DATA INPUT LATCH AND DATA CLOCKING SCHEME

(75) Inventors: Yuen Hung Chan, Poughkeepsie, NY (US); Elspeth Anne Huston, Poughkeepsie, NY (US); Michael Ju Hyeok Lee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 12/166,421

(22) Filed: Jul. 2, 2008

(65) Prior Publication Data
US 2010/0002525 A1    Jan. 7, 2010

(51) Int. Cl.
*G11C 7/10*    (2006.01)
(52) U.S. Cl. .................. 365/189.05; 365/154
(58) Field of Classification Search ............ 365/189.05, 365/189.08, 154, 233.1
See application file for complete search history.

(56) References Cited

U.S. PATENT DOCUMENTS

| | | | |
|---|---|---|---|
| 5,663,965 A | 9/1997 | Seymour | |
| 5,748,643 A * | 5/1998 | Pelella et al. | 714/726 |
| 6,138,208 A | 10/2000 | Dhong et al. | |
| 6,591,388 B1 | 7/2003 | Vonreyn | |
| 6,631,419 B1 | 10/2003 | Greene | |
| 7,054,184 B2 * | 5/2006 | Chan et al. | 365/154 |
| 7,152,194 B2 | 12/2006 | Vinke | |
| 7,293,209 B2 * | 11/2007 | Chan et al. | 714/724 |
| 7,535,776 B1 * | 5/2009 | Behrends et al. | 365/189.15 |
| 2006/0195738 A1 | 8/2006 | Chan et al. | |

OTHER PUBLICATIONS

"High performance reception with scannable dynamic latch—combining ECL receiver with level-sensitive scan design latch for boundary scan operation," Derwent Information Ltd., RD 338004 A, Jun. 10, 1992.

* cited by examiner

*Primary Examiner*—Anh Phung
(74) *Attorney, Agent, or Firm*—William A. Kinnaman, Jr.

(57) ABSTRACT

A data input latch and clocking method and apparatus for high performance SRAM in which an L1 data input latch is controlled by a logical combination of the normal local clock buffer clock signal and the local array clock buffer clock signal. This logical combination of clock signals minimizes the hold time of the L1 latch provides a fast cycle time in which the SRAM macro can process successive write instructions while avoiding early mode issues.

20 Claims, 5 Drawing Sheets

Issues : 1) Early launch of L1 at mid cycle at high frequency, posting early mode concerns
2) Early mode problem if lckl is delayed or its pulse width is widen

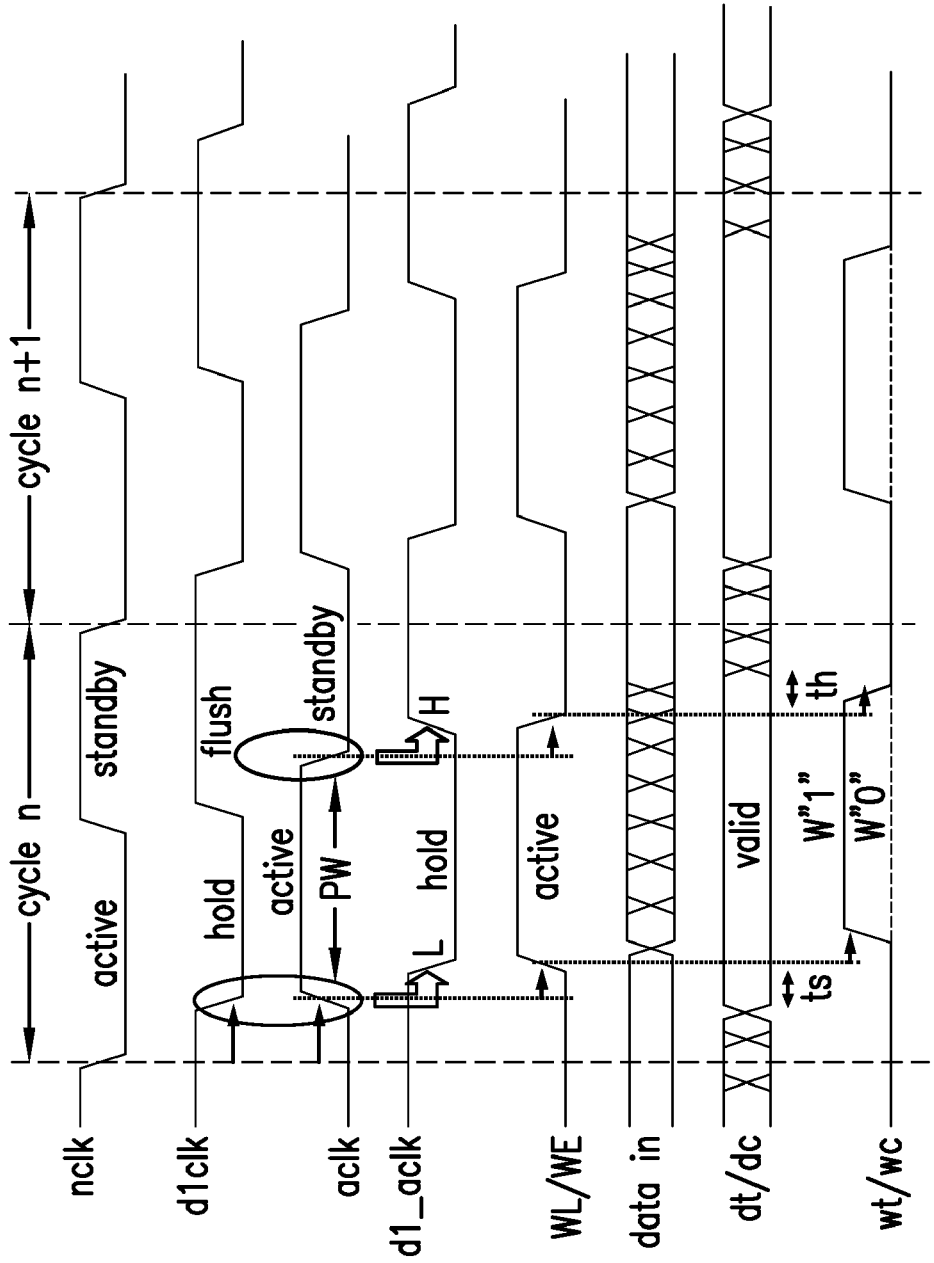

ARRAY DATA INPUT LATCH AND DATA CLOCKING SCHEME

CROSS-REFERENCE TO RELATED APPLICATIONS

This application contains subject matter that is related to the subject matter of the following co-pending applications, each of which is assigned to the same assignee as this application, International Business Machines Corporation of Armonk, N.Y. Each of the below listed applications is hereby incorporated herein by reference in its entirety: Low Power Programmable Clock Delay Generator with Integrated Decode Function, Ser. No. 12/109728

FIELD OF THE INVENTION

This invention relates to static random access memory (SRAM) arrays and more particularly to an improved method and logic for high-speed access to the array in writing data into the array.

BACKGROUND OF THE INVENTION

As will be appreciated by those skilled in the art, in reading and writing data from and into an SRAM array at high speed, the relative arrival and set up time of various signals that provide access to the array is can be limiting factor in the overall speed of operation of the array. At the state of the art speed of SRAM operation, there is an inherent range of arrival and set up times of the data and address signals for which allowance must be made.

FIG. 1 is a functional block diagram of a state of the art prior art SRAM macro. The Memory Array has boundary L1/L2 latches at its address input (ADDR) and at its data output (Data Out_q). For application flexibility, the array also provides an unlatched output labeled Data Out. These inputs and output are fully static. The boundary latches are controlled by a normal Local Clock Buffer (nLCB) clock signal generated from the system clock nclk. The nLCB generates d1clk and lclk clocks to control respectively the L1 and L2 race-free boundary latches. An array Local Clock Buffer (array LCB) generates from the system clock nclk a local clock signal aclk for internal array circuit timing control. Both the nLCB and array LCB are programmable to provide timing adjustments on leading edge, trailing edge, and pulse width (PW) of the local clocks. This programmable control is provided by the GPTR (General Purpose Test Register) scannable latches. Each LCB has its own set of GPTR latches so that it could be programmed independently. As shown in FIG. 1, the address latches, data-in latches, and data_out latches all have their own nLCB. The array bit decode path, the word decode path (WD lsb, or least significant bit, and WD msb, or most significant bit), and the read/write decode path (RW Dec) each also has separated array LCB. This scheme of macro internal clocking topology provides maximum circuit timing control flexibility for performance optimization and hardware debug capability. The nominal timing sequence of the array inputs and the control clocks are illustrated in FIG. 5.

Referring to FIGS. 1 and 5, a brief description of the SRAM functional blocks and operational sequence are now given. The array macro inputs (address, data-in, read/write control) have boundary L1/L2 latches. At the beginning of a cycle when nclk falls, d1clk from the nLCB is driven low to close (hold state) the boundary L1 latches, and the lclk is driven high to open (flush state) the boundary L2 latches. With d1clk falling and lclk rising, the inputs are captured and held in the L1 and L2 latches. Output from the L1 or L2 latches are then sent to subsequent array peripheral circuits for decoding and read/write control function. When nclk falls, aclk from the array LCB is driven high to activate the dynamic bit, word, and read/write decode circuits. Dynamic circuits are typically used in state of the art high performance SRAMs because of their faster switching time. Static signals from the L1 latches shown in FIG. 1 must arrive at these dynamic circuits before the aclk is activated. In the word selection path, two levels of word decode is illustrated in the FIG. 1 SRAM functional block diagram. Level 1 consists of the lsb (least significant bits) and msb (most significant bits) Word Decoders (WD). Level 2 is performed by the WL Dec Drv (Word Line Decode and Drive) block. A selected wordline's (WL) leading edge (rising transition) is triggered by the leading edge of aclk, and its trailing edge (falling transition) is controlled by the aclk falling. The selected WL's active window is therefore determined by the aclk's active pulse width (PW). Similarly as shown in the timing diagram, the dynamic WE (Write Enable) signal also resembles that of the WL. The WE signal is driven off from the RW Dec/Drv (Read Write Decode/Drive) block and is used to generate dynamic true/complement write data (wt/wc) from the static data L1/L2 latch to write the Memory Array.

For a read or write-through operation, after a wordline and a bit column is selected (a bit column is selected by the Bit Dec and Column decode/select blocks), read or write-through data from the Memory Array is then passed to the array output driver.

For an array write operation, data-in for writing is captured and sent off by the data-in L1/L2 latches. The static data from the L1/L2 latches (dt and dc signals as shown in FIG. 5 timing diagram) must arrive at the Read/Write Control block before the dynamic WE or WL signals arrive to start the Memory Array's read/write operation. This data setup time requirement is denoted by the "ts" time in the timing diagram. The static data dt/dc must also be held stable for the full duration of the WL/WE active window in order to guarantee a successful write operation. This hold time requirement is denoted by the "ts" time in the timing diagram.

FIG. 2 is one prior art implementation of a data input latch used in the macro shown in FIG. 1. In this implementation, the data input to the L1 stage is clocked into that stage in response to the leading edge of the d1clk signal generated by the local clock buffer nLCB in response to the system clock signal nclk. The output of the L1 stage is latched into the L2 stage in response to the lclk clock leading (rising) edge, which is also generated by the nLCB. One drawback is that the parameters that determine the timing of the launch of the data from the L2 necessarily have a range of values. This can result in a late launch of the L2 data so that the data at the input to the memory array does not have the set up time required by the memory array. This will cause a slower write performance, degrading the SRAM macro's overall cycle time capability. An additional drawback is the chip area and power required for both an L1 and an L2 latches.

FIG. 3 is a data input latch similar to FIG. 2, but using only an L1 latch to latch and launch the input data. This allows a fast launch of the input data from the L1 latch with a static input that supports fast cycle times. However, the early launch of the L1 data in the middle of a high frequency memory cycle, gives rise to the possibility that the data will arrive before the current write operation time window expires; referred to in the art as an early mode issue. It will be appreciated that early mode problems arise also if the ackl clock signal is delayed with respect to its designed timing, or the pulse width PW of the aclk is wider than the design pulse width. The aclk delay or PW is programmable by the array LCB and will be altered as needed during hardware debug and characterization. It is essential to avoid this potential early mode problem cause by internal aclk timing adjustments.

SUMMARY OF THE INVENTION

An object of this invention is the provision of a data input latch and clocking method and apparatus for high performance SRAM that provides fast launching of data to the memory array, provides static data inputs to the array, and eliminates early mode issues at the data input to the array.

Another object of the invention is the provision of a data input latch and clocking method and apparatus for high performance SRAM that is economical in its use of silicon real estate and its consumption of power.

Briefly, this invention contemplates the provision of a data input latch and clocking method and apparatus for high performance SRAM in which an L1 data input latch is controlled by a logical combination of the normal local clock buffer clock signal and the local array clock buffer clock signal. This logical combination of clock signals minimizes the hold time of the L1 latch provides a fast cycle time in which the SRAM macro can process successive write instructions while avoiding early mode issues.

Programmable clock buffers, such as those described in the above referenced co-pending application, provide flexibility to meet application specific requirements.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is a timing diagram showing the timing of various signals in FIGS. 1 to 4.

DETAILED DESCRIPTION OF THE INVENTION

Figure 4:
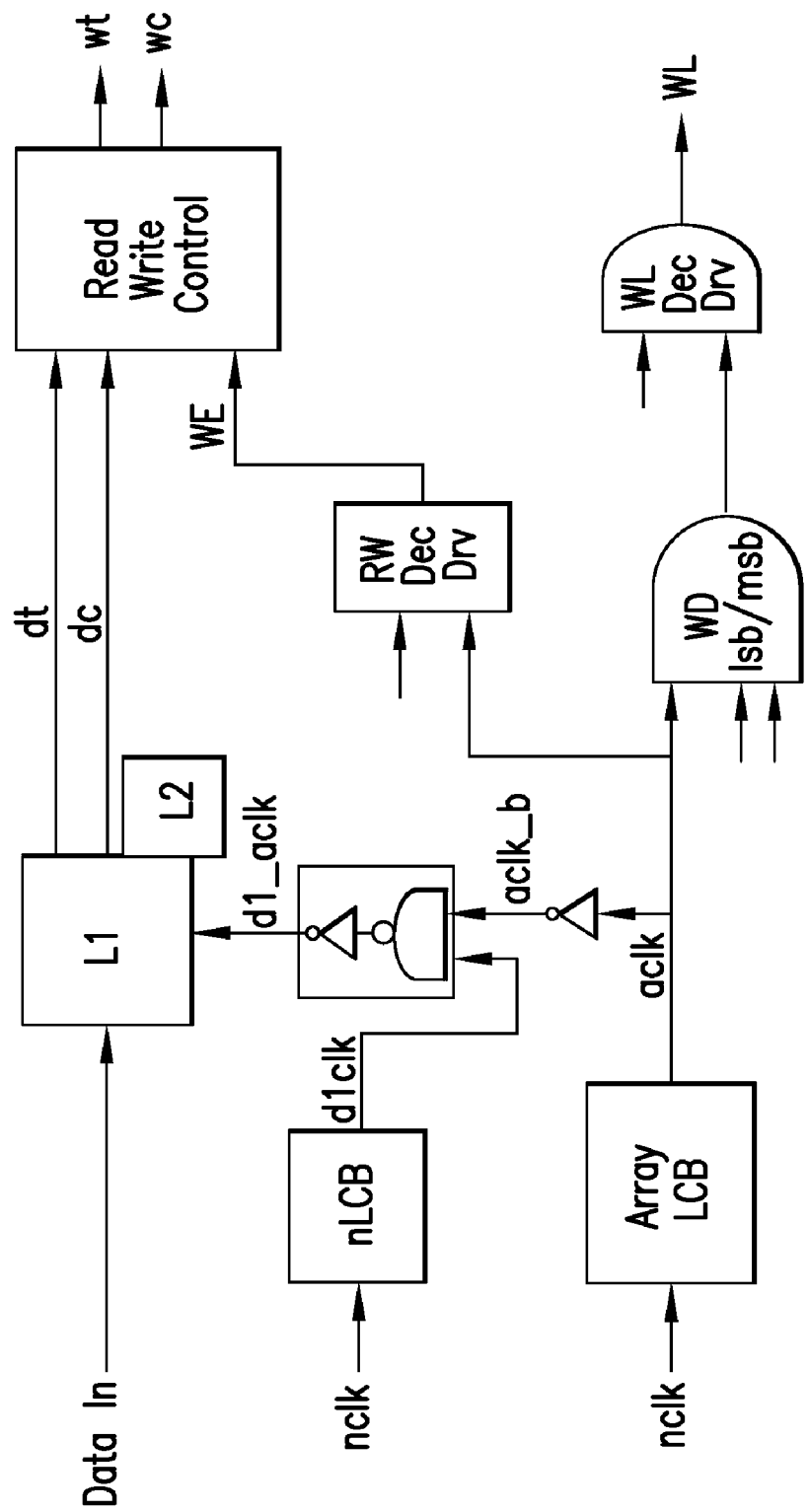
FIG. 4 is a functional block diagram of one embodiment of an SRAM data latch and clocking scheme in accordance with the teachings of this invention.

Referring now to FIGS. 4 and 5 of the drawings, the input data "data_in" to be written into the SRAM is coupled as an input to a clock controlled latch L1. The L2 latch attached is only used for scan purpose and will not have an active function in normal mode operation of this invention. The output of the latch L1 is a static output "dt/dc" (data-true/data-complement) is coupled as the input to the SRAM via the dynamic Read/Write Control circuit. The system clock "nclk" is coupled as an input to the local clock buffer nLCB whose output d1clk is coupled as one input to an AND gate. The system clock nclk is also coupled as an input to an SRAM array lock clock buffer "Array LCB" whose output alck is coupled via an inverter as the other input "aclk_b to the AND gate and also to the write enable WE via the Read Write Decode/Driver block "RW Dec Drv" and to the WordLine (WL) via the first level word decode (WD lsb/msb) and second level word decode/driver (WL Dec Drv). The inverted clock signal output "d1_aclk" of the AND gate serves as the clock input to the latch L1, in order to latch the data_in signal when the d1_aclk signal goes high.

Referring now to FIG. 5 in addition to FIG. 4. In the illustrated embodiment, nclk is a negative active clock (a positive active clock will also function in a similar fashion). Absent the combinational logic of this invention, at the beginning of a cycle, nclk leading edge (falling transition) triggers the d1clk trailing edge (falling transition) to close the L1 latch and put it in a "data-hold" state. At the middle of the cycle when nclk rises, d1clk is driven high to open up the L1 latch to "flush" mode to accept input data again for the next cycle. When nclk falls at the beginning of a cycle, the array LCB triggers a leading edge (rising) of the aclk. The aclk serves as the principal array internal clocks for dynamic circuit timing control. Here, the logical "AND" of the d1clk from the nLCB and the aclk_b (aclk complement) from the array LCB generates a combined L1 clock signal d1_aclk. The d1_aclk is driven low (hence putting the L1 latch in "hold" state") at the beginning of the cycle by either the falling of the d1clk or the rising of the aclk. Whichever one of these two clocks arrives first will trigger the combined d1_aclk to fall. At this time, the L1 latch is closed, the input data can now change and be set up for the next new cycle. This clocking scheme enables the data input hold time to be kept as low as possible to support fast cycle time. Since the L1 latch is closed when d1_aclk goes low, its output (dt/dc) remains stable throughout the duration of the active array window for a write operation.

At the beginning of a read/write operation, the array internal clock aclk rises. It triggers the WL and WE to go high to start an active read or write operation. The rising of WE signal also triggers the dynamic write data bus wt/wc (write true/write complement) to go active for a write operation. Since the array internal clock aclk controls the starting and ending of the WL/WE signals, the duration (length) of an active read/write window is therefore determined by the pulse width (PW) of the aclk.

Figure 1:
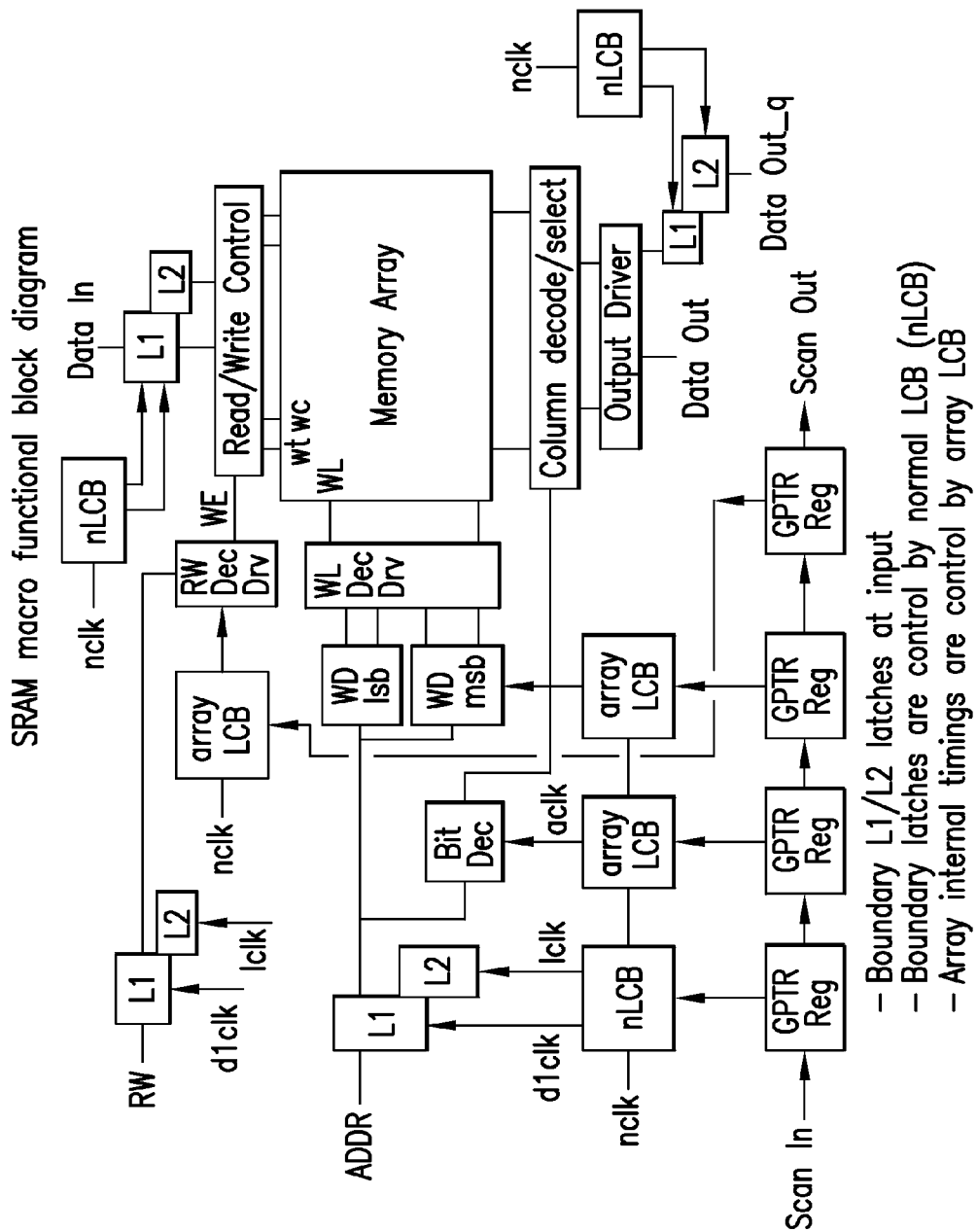
FIG. 1 is a functional block diagram of a prior art an SRAM macro.
Figure 2:
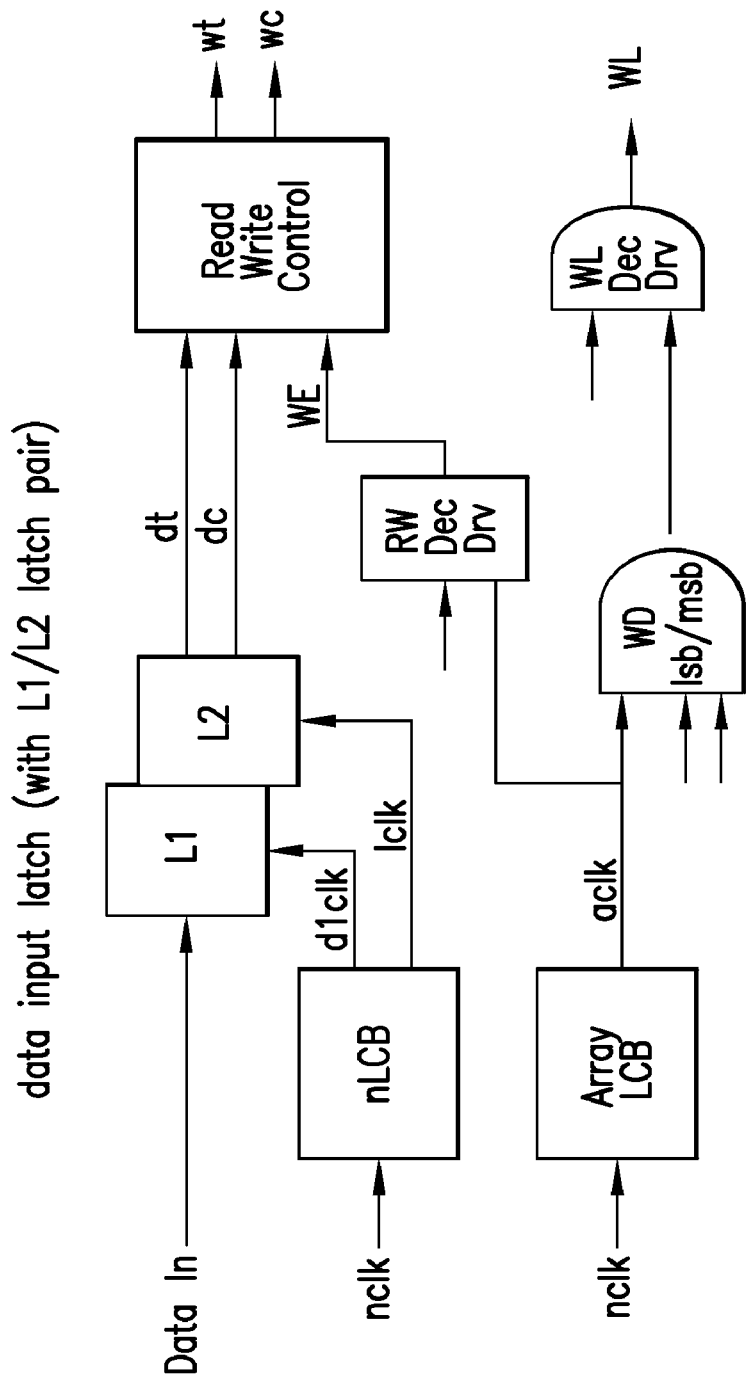
FIG. 2 is a functional diagram of a prior art data input latch with L1/L2 latch pair.
Figure 3:
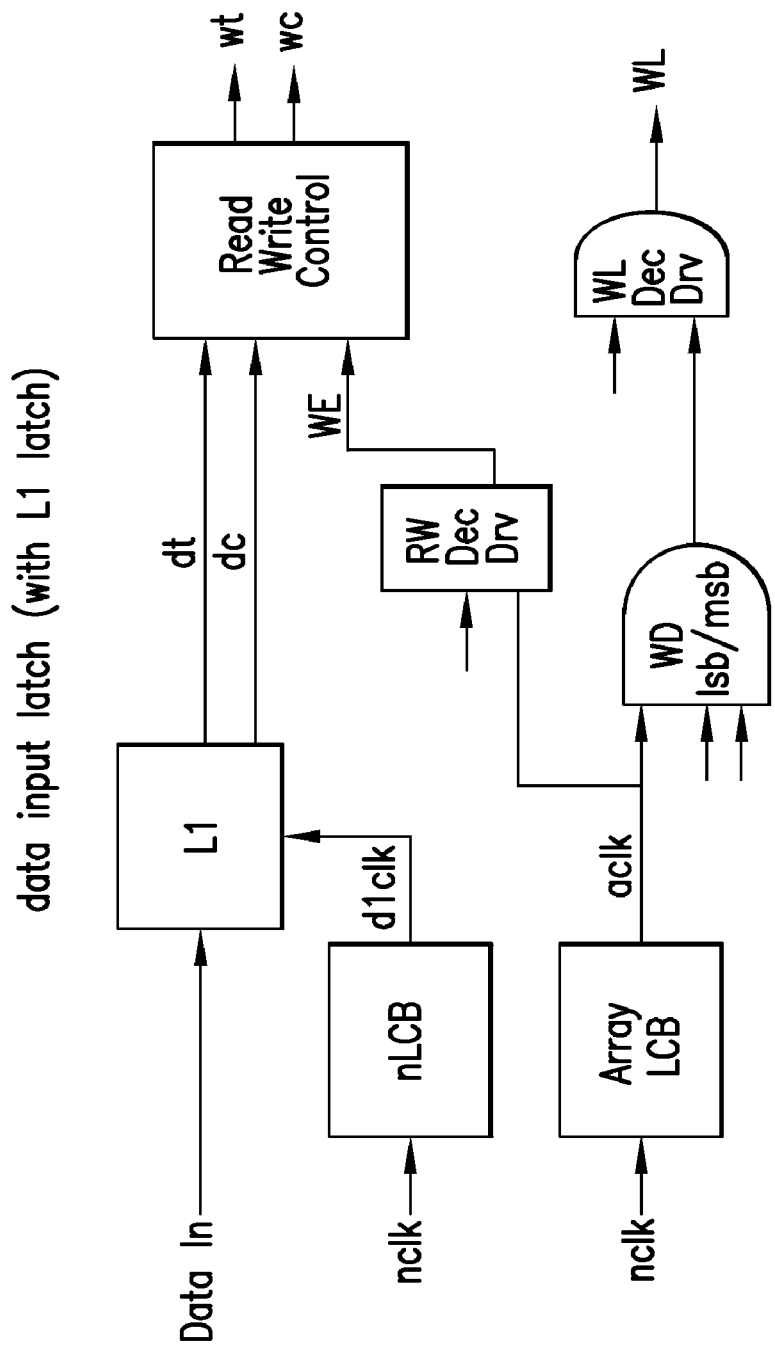
FIG. 3 is a functional block diagram similar to FIG. 2 showing details of an L1 data input latch.

At the end of an array read/write operation, the array internal clock aclk falls, this triggers the trailing edge of WL, WE, and wt/wc dynamic signals to fall to its standby state. At this state, the static data signal dt/dc can change again for the next cycle. When aclk falls, signifying the end of an active cycle, it also drives the combined d1_aclk to go high. This turns the data-in L1 latch back on again, allowing the next cycle data dt/dc to come through. The falling of aclk, or the rising of the d1clk, which ever comes later, triggers the rising of the combined d1_aclk. This clocking scheme enables the write data to be held stable until the end of an active write window to avoid early mode problem as described earlier. Furthermore, at fast cycle time, aclk falling is typically later than the d1clk rising, the d1_aclk turning on is therefore mainly governed by the trailing edge of aclk. When the array LCB is programmed to have different delay or pulse width settings than the normal design default, the d1_aclk leading edge will track closely with these aclk trailing edge timing changes. The early mode exposure seen in prior art design as described in FIG. 3 is totally eliminated.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A static random access memory (SRAM) comprising in combination:
   an array of memory cells;
   write control logic coupled to said array of memory cells to control the writing of data in to said array of memory cells, said write control logic having a data input and a write enable input;
   a programmable array local clock buffer for generating a write enable clock signal having an active state and a standby state coupled to said write enable input of said write control logic;
   an L1 data latch with a data input, a data output coupled directly to the data input of said write control logic, and clock signal input establishing hold and flush states of said L1 data latch;
   a programmable normal local clock buffer for generating an L1 clock signal having a hold state and a flush state;
   a logic circuit for combining said write enable clock signal and said L1 clock signal to generate a clock signal coupled to said clock input of said L1 data latch that maintains said L1 Latch is in hold state until the end of the active state of the write enable clock.

2. A static random access memory (SRAM) as in claim 1 wherein said clock signal coupled to the input of said L1 data latch switches from its flush state to its hold state in response to first to occur of the hold state of said L1 clock signal or the active state of said write enable clock signal.

3. A static random access memory (SRAM) as in claim 1 wherein said clock signal coupled to the input of said L1 data latch maintains said L1 Latch is in hold state until the end of the active state of the write enable clock.

4. A static random access memory (SRAM) as in claim 3 wherein said clock signal coupled to the input of said L1 data latch switches from its flush state to its hold state in response to first to occur of the hold state of said L1 clock signal or the active state of said write enable clock signal.

5. A static random access memory (SRAM) as in claim 1 wherein said logic circuit includes an AND function.

6. A static random access memory (SRAM) as in claim 2 wherein said logic circuit includes an AND function.

7. A static random access memory (SRAM) as in claim 3 wherein said logic circuit includes an AND function.

8. A static random access memory (SRAM) as in claim 1 wherein the pulse width of the L1 clock signal is programmable.

9. A static random access memory (SRAM) as in claim 2 wherein the pulse width of the L1 clock signal is programmable.

10. A static random access memory (SRAM) as in claim 3 wherein the pulse width of the L1 clock signal is programmable.

11. A static random access memory (SRAM) as in claim 1 wherein the pulse width of the write enable clock signal is programmable.

12. A static random access memory (SRAM) as in claim 2 wherein the pulse width of the write enable clock signal is programmable.

13. A static random access memory (SRAM) as in claim 3 wherein the pulse width of the write enable clock signal is programmable.

14. A static random access memory (SRAM) as in claim 9 wherein the pulse width of the write enable clock signal is programmable.

15. A static random access memory (SRAM) as in claim 10 wherein the pulse width of the write enable clock signal is programmable.

16. A static random access memory (SRAM) as in claim 11 wherein the pulse width of the write enable clock signal is programmable.

17. A method for writing data to a random access memory array including the steps of: storing the data in an L1 latch in response to a clock signal that is a logical combination of a clock signal generated by a programmable system local clock buffer and a programmable array local clock buffer.

18. A method for writing data to a random access memory array as in claim 17 including the further steps of transferring data stored in said L1 latch directly to a write controller.

19. A method for writing data to a random access memory array as in claim 17 including the further step of holding data stored in said L1 latch for at least the duration of a write enable clock signal.

20. A method for writing data to a random access memory array as in claim 18 including the further step of holding data stored in said L1 latch for at least the duration of a write enable clock signal.

* * * * *